United States Patent
Hong

(10) Patent No.: US 9,601,714 B2
(45) Date of Patent: Mar. 21, 2017

(54) DISPLAY DEVICE

(71) Applicant: Samsung Display Co., Ltd., Yongin, Gyeonggi-Do (KR)

(72) Inventor: Sang-Min Hong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 215 days.

(21) Appl. No.: 14/451,269

(22) Filed: Aug. 4, 2014

(65) Prior Publication Data
US 2015/0263309 A1 Sep. 17, 2015

(30) Foreign Application Priority Data
Mar. 17, 2014 (KR) .................. 10-2014-0031165

(51) Int. Cl.
*G06F 3/041* (2006.01)
*H01L 51/52* (2006.01)
*H01L 27/32* (2006.01)

(52) U.S. Cl.
CPC ........ *H01L 51/5246* (2013.01); *H01L 27/323* (2013.01)

(58) Field of Classification Search
CPC ............ H01L 51/5246; H01L 27/3272; H01L 27/323; G06F 2203/041; G06F 3/03547; G06F 3/041; G06F 3/0412; G06F 3/0414; G06F 3/0416; G06F 3/046; G06F 3/043
See application file for complete search history.

(56) References Cited

U.S. PATENT DOCUMENTS

| 2005/0248711 A1* | 11/2005 | Miyazaki .............. G02F 1/1339 349/153 |
| 2010/0186449 A1 | 7/2010 | Aitken et al. |
| 2011/0001706 A1* | 1/2011 | Sanford ................ G06F 3/0412 345/173 |
| 2011/0122628 A1* | 5/2011 | Han ..................... H01L 51/5246 362/267 |
| 2011/0134056 A1 | 6/2011 | Kim et al. |
| 2011/0242012 A1* | 10/2011 | Liu ........................ G06F 3/0412 345/173 |
| 2011/0308082 A1* | 12/2011 | Chen .................... H05K 3/0008 29/852 |

(Continued)

FOREIGN PATENT DOCUMENTS

| KR | 10-2000-0075236 A | 12/2000 |
| KR | 10-2001-0072397 A | 7/2001 |

(Continued)

*Primary Examiner* — Premal Patel
(74) *Attorney, Agent, or Firm* — Knobbe Martens Olson & Bear LLP

(57) ABSTRACT

A display device is disclosed. In one aspect, the display device comprises a display panel, a window cover, at least one align key and a sealing portion. The display panel includes a substrate, a display unit formed over the substrate, and an encapsulation portion formed over the display unit. The window cover is formed over the display panel. The at least one align key is formed on the encapsulation portion and configured to align the display panel with the window cover. The sealing portion is formed between the substrate and the encapsulation portion, wherein the align key has at least one laser beam through portion passing through the encapsulation portion and is connected to the sealing portion.

18 Claims, 6 Drawing Sheets

(56) References Cited

U.S. PATENT DOCUMENTS

| | | |
|---|---|---|
| 2012/0048462 A1 | 3/2012 | Lee |
| 2012/0287357 A1 | 11/2012 | Misaki |
| 2014/0062955 A1* | 3/2014 | Hotelling .............. G06F 3/0416 |
| | | 345/174 |

FOREIGN PATENT DOCUMENTS

| | | |
|---|---|---|
| KR | 10-0448044 B1 | 9/2004 |
| KR | 10-2008-0001536 A | 1/2008 |
| KR | 10-1082162 B1 | 11/2011 |
| KR | 10-2012-0020942 A | 3/2012 |
| KR | 10-2012-0062178 A | 6/2012 |
| KR | 10-2012-0088842 A | 8/2012 |
| KR | 10-2012-0113771 A | 10/2012 |

* cited by examiner

DISPLAY DEVICE

INCORPORATION BY REFERENCE TO ANY PRIORITY APPLICATIONS

This application claims the benefit of Korean Patent Application No. 10-2014-0031165, filed on Mar. 17, 2014, in the Korean Intellectual Property Office, the disclosures of which is incorporated herein in its entirety by reference.

BACKGROUND

Field

The described technology generally relates to a display device.

Description of the Related Technology

In general, display devices such as an organic light-emitting diode (OLED) displays including a thin film transistor (TFT) can be used for mobile applications such as smartphones, tablets, laptop computers, digital cameras, camcorders, and portable information terminals, or electric/electronic appliances such as ultraslim TVs.

SUMMARY OF CERTAIN INVENTIVE ASPECTS

One inventive aspect is a display device having an improved structural strength of a sealing portion.

Another aspect is a display device that includes: a display panel including a substrate on which a display unit is formed, and an encapsulation portion for encapsulating the substrate; a touch screen panel formed on the encapsulation portion; a window cover formed on the touch screen panel; an align key for aligning locations of the display panel and the window cover; and a sealing portion formed between the substrate and the encapsulation portion, wherein the align key includes at least one laser beam through portion that provides a path for passing a laser beam through the encapsulation portion to the sealing portion.

The align key can be formed on the encapsulation portion to correspond to the sealing portion perpendicularly to a direction in which the display panel is formed.

The sealing portion and the align key can be located to overlap with each other, and the at least one laser beam through portion can include at least one space formed in the align key.

An outer appearance of the align key can be configured by a plurality of lines, which are intermittently arranged to be separate from each other, and the at least one laser beam through portion can correspond to a space between the plurality of lines.

The align key can include a plurality of lines that are arranged in dot types.

The sealing portion can be a continuous line formed along an edge of the display panel.

The align key can be formed at least one of corners of the display panel.

The touch screen panel can include a plurality of electrode pattern units formed on the encapsulation portion and at least one insulating layer separating the plurality of electrode pattern units from each other, and the align key can be formed at a surface located at the same level as a surface of the encapsulation portion, on which touch screen panel lines electrically connected to the plurality of electrode pattern units are formed.

The substrate can include an active area on which the display unit is formed, a circuit area extending to outside of the active area, and a cell seal area extending to outside of the circuit area and including the sealing portion, the touch screen panel lines can be formed on the encapsulation portion corresponding to the circuit area, and the align key can be formed on the encapsulation portion corresponding to the cell seal area.

The align key can be formed of a conductive material.

The sealing portion can include a glass frit.

Another aspect is a display device comprising a display panel, a touch screen panel, a window cover, at least one align key, and a sealing portion. The display panel includes a substrate, a display unit formed over the substrate, and an encapsulation portion formed over the display unit. The touch screen panel is formed over the encapsulation portion. The window cover is formed over the touch screen panel. The align key is configured to align the display panel with the window cover. The sealing portion is formed between the substrate and the encapsulation portion, wherein the align key has at least one laser beam through portion configured to permit passage of a laser beam through the encapsulation portion to the sealing portion.

In the above display device, the align key is formed on the encapsulation portion to align with the sealing portion formed on the display panel. In the above display device, the sealing portion and the align key at least partially overlap each other.

In the above display device, the align key further comprises a plurality of align key portions separated from each other, wherein the at least one laser beam through portion corresponds to a space between the align key portions. In the above display device, each of the align key portions has a substantially dot shape, wherein the align key portions have a dot pattern.

In the above display device, the sealing portion is substantially continuously formed along edges of the display panel.

In the above display device, the align key is formed in a corner of the display panel.

In the above display device, the touch screen panel comprises a plurality of electrode pattern units formed on the encapsulation portion and at least one insulating layer separating the electrode pattern units from each other, wherein the align key is formed on a surface of the encapsulation portion, and wherein a plurality of touch screen panel lines electrically connected to the electrode pattern units are formed on the encapsulation portion.

In the above display device, the electrode pattern units comprise first and second electrode pattern units, wherein the first electrode pattern units are spaced apart from each other and arranged in a first direction, and wherein the second electrode pattern units are spaced apart from each other and arranged in a second direction crossing the first direction In the above display device, the substrate comprises an i) active area on which the display unit is formed, ii) a circuit area extending from the active area, and iii) a cell seal area extending from the circuit area and including the sealing portion, wherein the touch screen panel lines are formed on the encapsulation portion corresponding to the circuit area, and wherein the align key is formed on the encapsulation portion corresponding to the cell seal area.

In the above display device, the align key is formed of a conductive material.

In the above display device, the touch screen panel is one of the following: a resistive type touch screen, an electromagnetic type touch screen, a saw type touch screen, and an infrared type touch screen.

In the above display device, the display unit comprises a thin film transistor (TFT) and an organic light-emitting diode i) electrically connected to the TFT and ii) including first and second electrodes and an emission layer formed between the first and second electrodes.

In the above display device, the sealing portion comprises a glass frit.

DETAILED DESCRIPTION OF CERTAIN INVENTIVE EMBODIMENTS

Figure 1:
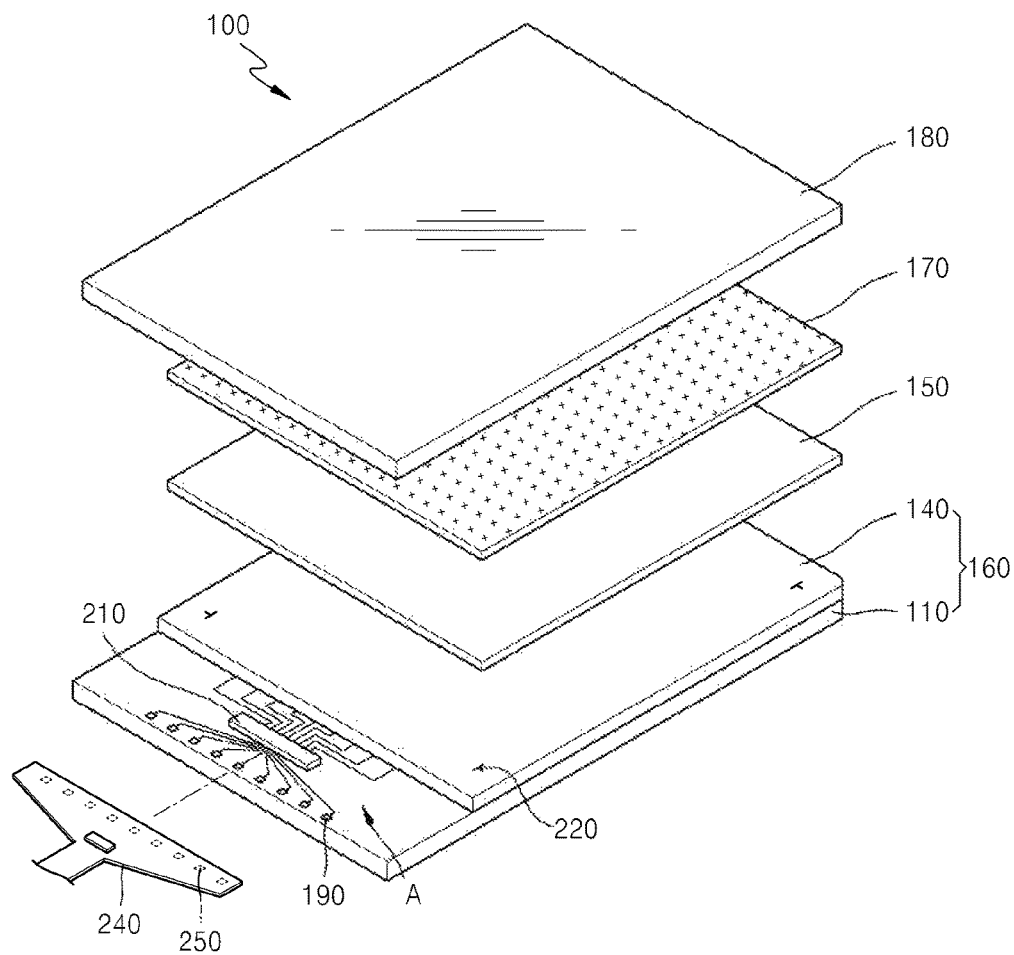
FIG. 1 is an exploded perspective view of a display device according to an embodiment.

In order to reduce dead space, one method is to reduce the width of a sealing portion formed between the encapsulating layer and the display unit. Align keys have been developed so as to reduce light leakage, but the sealing portion below the align keys are weaker than in areas without the align keys, resulting in damage to the display devices. As the width of the sealing portion decreases, the strength of the sealing portion also decreases, which further weakens the structure of the display panel.

As the described technology allows for various changes and numerous embodiments, particular embodiments will be illustrated in the drawings and described in detail in the written description. However, this is not intended to limit the described technology to particular modes of practice, and it is to be appreciated that all changes, equivalents, and substitutes that do not depart from the spirit and technical scope of the described technology are encompassed in the described technology. In the description of the described technology, certain detailed explanations of the related art are omitted when it is deemed that they can unnecessarily obscure the essence of the described technology.

While such terms as "first," "second," etc., can be used to describe various components, such components must not be limited to the above terms. The above terms are used only to distinguish one component from another.

The terms used in the present specification are merely used to describe particular embodiments, and are not intended to limit the described technology. An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof can exist or can be added. As used herein, the term "and/or" includes any and all combinations of one or more of the associated listed items. Expressions such as "at least one of," when preceding a list of elements, modify the entire list of elements and do not modify the individual elements of the list.

Hereinafter, the described technology will be described in detail by explaining embodiments of the described technology with reference to the attached drawings. Like reference numerals in the drawings denote like elements. In this disclosure, the term "substantially" includes the meanings of completely, almost completely or to any significant degree under some applications and in accordance with those skilled in the art. Moreover, "formed on" can also mean "formed over."

Figure 2:
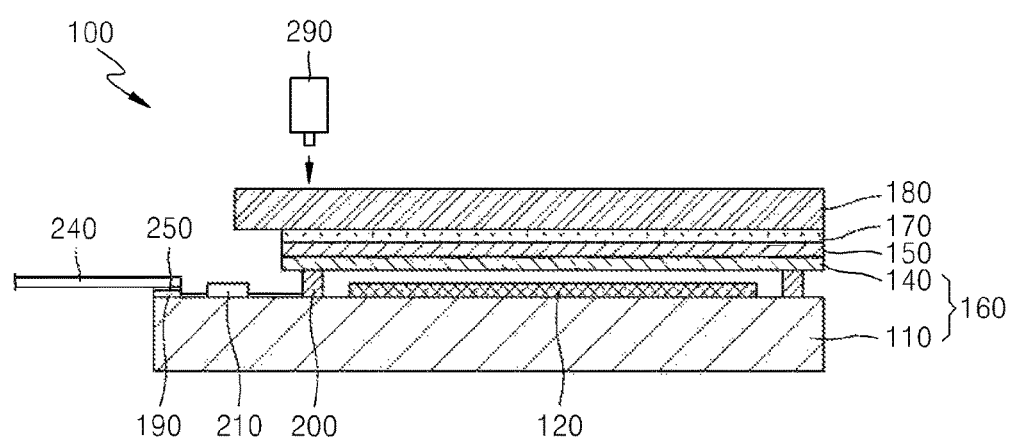
FIG. 2 is a cross-sectional view of the display device of FIG. 1 in a coupled state.

FIG. 1 is an exploded perspective view of a display device 100 according to an embodiment of the described technology, and FIG. 2 is a cross-sectional view of the display device 100 of FIG. 1 in a coupled state.

In the description below, an organic light-emitting diode (OLED) display is described as an example for the display device 100. However, the display device 100 can be, for example, a liquid crystal display (LCD) device, a field emission display (FED) device, an electronic paper display (EPD) device, etc.

Referring to FIGS. 1 and 2, the display device 100 includes a display panel 160 including a substrate 110 and an encapsulation portion 140 provided on the substrate 110.

A display unit 120 for displaying images is formed on the substrate 110. The display unit 120 can include at least one thin film transistor (TFT), and an OLED electrically connected to the TFT.

The substrate 110 can be a glass substrate having rigidity, a polymer substrate, a film having flexibility, a metal substrate, or a composite substrate thereof.

The encapsulation portion 140 can be a glass substrate, a polymer resin, or a film having flexibility. The encapsulation portion 140 can be formed by alternately stacking organic layers and inorganic layers.

A sealing portion 200 is formed on surfaces of the substrate 110 and the encapsulation portion 140 facing each other in order to encapsulate a region where the display unit 120 is formed. The sealing portion 200 is formed along edges of the surfaces of the substrate 110 and the encapsulation portion 140 facing each other. The sealing portion 200 includes a glass frit.

A touch screen panel 150 is formed on the encapsulation portion 140. The touch screen panel 150 can be an on-cell touch screen panel formed by forming a touch screen pattern on the encapsulation portion 140. The touch screen panel 150 can be integrally formed with the encapsulation portion 140; however, embodiments of the described technology are not limited thereto.

A polarization plate 170 is formed on the touch screen panel 150. The polarization panel 170 can prevent external light from being reflected by the display unit 120.

A window cover 180 is formed on the polarization plate 170 and can protect the display panel 160, the touch screen panel 150, and the polarization plate 170. The window cover 180 can be formed of glass having rigidity.

An align key 220 can be formed for aligning the display panel 160 with the window cover 180. In some embodiments, the align key 220 is formed on the encapsulation portion 140. The align key 220 can be a mark that is formed to make the display panel 160 and the window cover 180 coupled to each other at the right positions.

An area A that extends from a first edge of the encapsulation portion 140 is formed on the substrate 110 so as to expose a portion of the substrate 110. A plurality of pads 190 are arranged to be spaced apart from each other in a direction substantially parallel to the first edge of the encapsulation portion 140 on the exposed area A.

Terminals 250 of a circuit board 240 are electrically connected to the pads 190 for receiving signals from outside. The circuit board 240 can be a flexible printed circuit board (FPCB) having flexibility.

A laser irradiation device 290 can be placed over the display device 100. A laser beam generated from the laser irradiation device 290 can be irradiated to the sealing portion 200. Then, the sealing portion 200 is melted to firmly couple or seal the substrate 110 and the encapsulation portion 140 to each other.

In addition, the display panel 160 and the window cover 180 can be aligned at the right positions by measuring the location of the align key 220 formed on the encapsulation portion 140 by using an optical measurement device.

Figure 3:
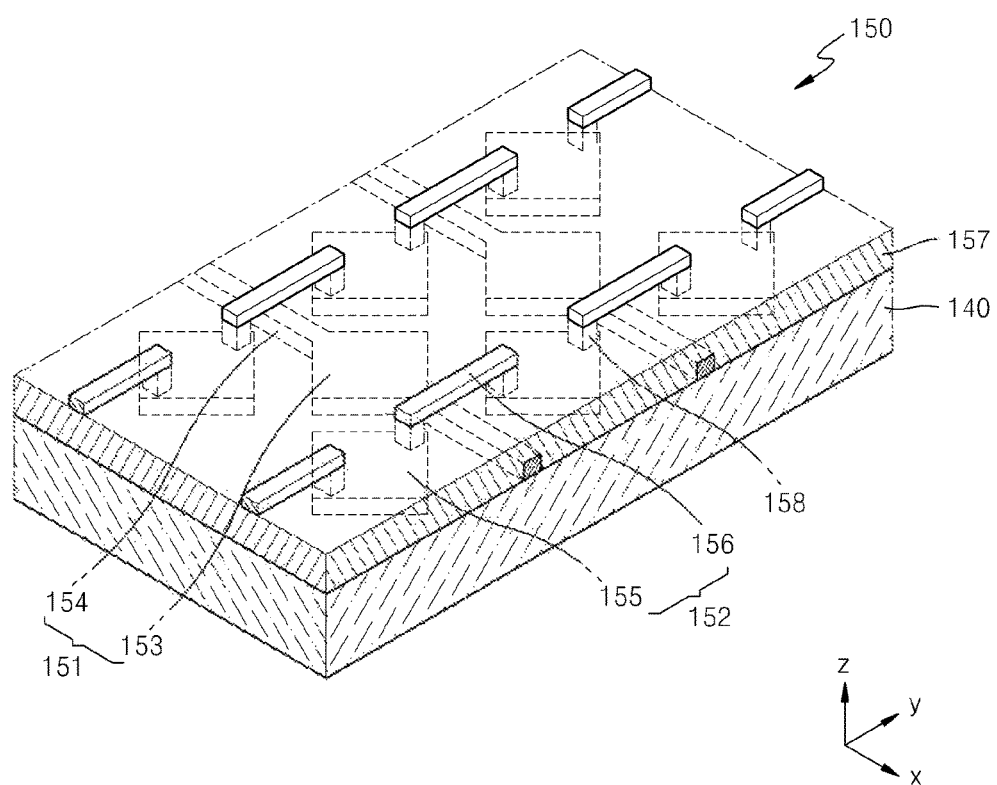
FIG. 3 is a perspective view of a touch screen panel shown in FIG. 1.

FIG. 3 is a cross-sectional view of the touch screen panel 150 shown in FIG. 1.

In the present embodiment, the touch screen panel 150 is an electrostatic capacitive type touch screen panel; however, one or more embodiments of the described technology are not limited thereto and the touch screen panel 150 can be applied to one of a resistive type touch screen, an electromagnetic type touch screen, a saw type touch screen, and an infrared type touch screen.

Referring to FIG. 3, the touch screen panel 150 is formed on the encapsulation portion 140. According to some embodiments, the touch screen panel 150 has an integrated structure directly formed on the encapsulation portion 140; however, the touch screen panel 150 can be formed on an additional substrate.

A plurality of first electrode pattern units 151 and a plurality of second electrode pattern units 152 are alternately formed on the encapsulation portion 140.

The first electrode pattern units 151 can be arranged substantially parallel to each other along a first direction (X-axis direction) of the encapsulation portion 140. The first electrode pattern units 151 can include a plurality of first main bodies 153 and a plurality of first connection portions 154 that electrically connect the plurality of first main bodies 153 to each other.

The plurality of first main bodies 153 are formed to have rhombus shapes. The plurality of first main bodies 153 are arranged in a row along the first direction (X-axis direction) of the encapsulation portion 140. The first connection portions 154 can be respectively formed between pairs of first main bodies 153 that are adjacent to each other in the first direction (X-axis direction). Each of the first connection portions 154 electrically connects a pair of first main bodies 153 to each other.

Each of the second electrode pattern units 152 is formed between a pair of first electrode pattern units 151. The second electrode pattern units 152 are arranged substantially parallel to each other along a second direction (Y-axis direction) of the encapsulation portion 140. The second electrode pattern units 152 can include a plurality of second main bodies 155 and a plurality of second connection portions 156 electrically connecting the second main bodies 155 to each other in the second direction (Y-axis direction).

The second main bodies 155 can be formed to have rhombus shapes. The second main bodies 155 can be arranged substantially parallel to each other along the second direction (Y-axis direction). Each of the second connection portions 156 connects a pair of second main bodies 155 to each other.

In some embodiments, the first electrode pattern units 151 that are adjacent to each other are connected to each other by the first connection portion 154 formed at the same plane as those of the first electrode pattern units 151. The pair of second electrode pattern units 152 that are adjacent to each other are connected to each other by the second connection portion 156 that is formed at a different plane than that of the first connection portion 154, so as to prevent interference with the first pattern units 151.

An insulating layer 157 at least partially covering the first electrode pattern units 151 and the second electrode pattern units 152 is formed on the encapsulation portion 140. The insulating layer 157 insulates the first and second electrode pattern units 151 and 152 from each other.

A plurality of contact holes 158 are formed in the insulating layer 157. The contact holes 158 are formed in portions corresponding to opposite corners of the second main bodies 155 that are adjacent to each other. The contact holes 158 are formed on regions where the first and second electrode pattern units 151 and 152 cross each other.

The second connection portions 156 are arranged across the insulating layer 157. Opposite ends in each of the second connection portions 156 extend in a vertical direction to be buried in the contact holes 158. The opposite ends of the second connection portion 156 contact upper surfaces of the second main bodies 155. Accordingly, each of the second connection portions 156 electrically connects the pair of adjacent second electrode pattern units 152 to each other.

The first and second electrode pattern units 151 and 152 can be formed through a photolithography process. That is, the first and second electrode pattern units 151 and 152 can be formed by patterning a transparent conductive layer that is formed by a deposition method, a spin coating method, a sputtering method, or an inkjet method. The first and second electrode pattern units 151 and 152 can be formed as transparent conductive layers, for example, formed of a transparent material such as indium tin oxide (ITO), indium zinc oxide (IZO), ZnO, or $In_2O_3$.

In addition, a protective layer (not shown) for covering the second connection portions 156 that connect the second electrode pattern units 152 to each other can be further formed on the insulating layer 157.

When an input unit such as a finger approaches or contacts the encapsulation portion 140, the touch screen panel 150 detects a touch location by measuring a variation in an electrostatic capacitance between the first and second electrode pattern units 151 and 152.

The display device 100 having such above structure can realize a touch panel function without increasing a thickness thereof. Also, the display device 100 can be the on-cell touch screen panel (TSP) type, in which the touch screen panel 150 is formed on the outer surface of the encapsulation portion 140. Thus, an amount of light reflection can be reduced even when external light is strong, and accordingly, a clear screen can be realized.

Figure 4:
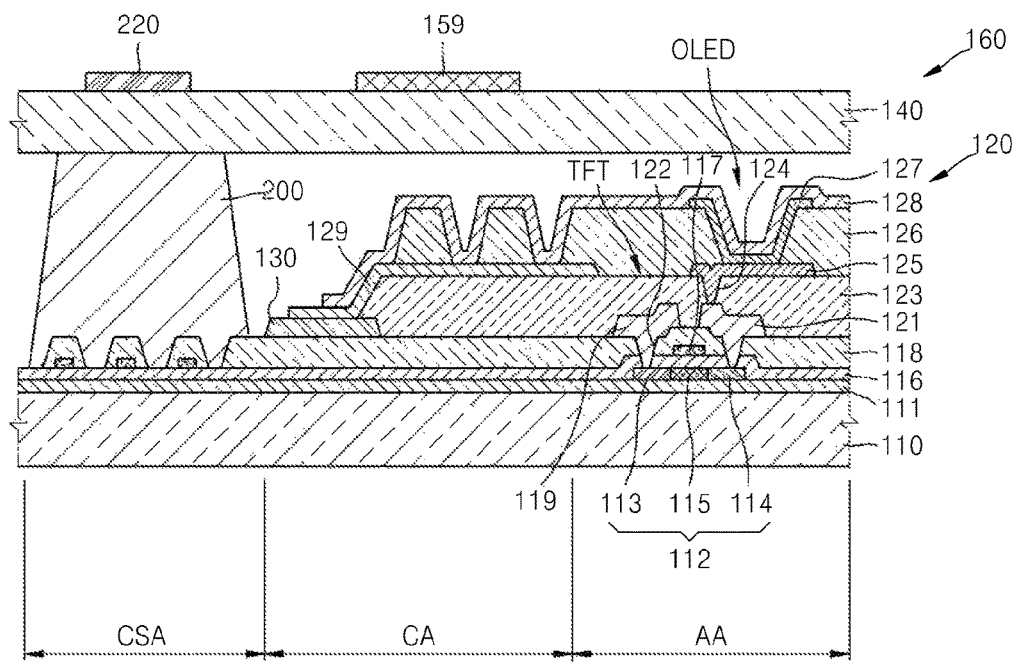
FIG. 4 is a partially cut cross-sectional view of a display panel shown in FIG. 1.

FIG. 4 is a partially cut cross-sectional view of the display panel 160 shown in FIG. 1.

Referring to FIG. 4, an active area AA on which the display unit 120 is formed, a circuit area CA extending from the active area AA, and a cell seal area CSA extending from the circuit area CA are formed on the substrate 110.

The active area AA includes a region on which pixels are formed, a region on which a TFT is formed, and a region on which a capacitor is formed. The circuit area CA includes a region on which circuit patterns are formed for electrically exchanging signals with the active area AA.

The cell seal area CSA includes a region on which the sealing portion 200 is formed.

The substrate 110 can be a glass substrate, a polymer substrate, a flexible film, a metal substrate, or a composite thereof. The substrate 110 can be transparent, opaque, or semi-transparent.

A barrier layer 111 is formed on the substrate 110. The barrier layer 111 is formed to provide a planarization layer on the substrate 110 and to prevent impurity elements from infiltrating into the substrate 110. The barrier layer 111 can include an organic layer, an inorganic layer, or a structure in which organic layers and inorganic layers are alternately stacked.

A semiconductor active layer 112 is formed on the barrier layer 111. The semiconductor active layer 112 can be formed of polycrystalline silicon; however, embodiments are not limited thereto and the semiconductor active layer 112 can be formed of an oxide semiconductor.

For example, the oxide semiconductor can include oxide of a material selected from metal atoms of groups IV, XII, XIII, and XIV such as zinc (Zn), indium (In), gallium (Ga), tin (Sn), cadmium (Cd), germanium (Ge), hafnium (Hf), and a composition thereof.

The semiconductor active layer 112 includes a source region 113 and a drain region 114 that are doped with N-type impurity ions or P-type impurity ions. A region between the source region 113 and the drain region 114 is a channel region 115 that is not doped with impurity ions.

A gate insulating layer 116 is formed on the semiconductor active layer 112. The gate insulating layer 116 can include a single layer or a multi-layered structure of an inorganic material such as silicon oxide, silicon nitride, or metal oxide.

A gate electrode 117 is formed on the gate insulating layer 116. The gate electrode 117 can include a single layer or a multi-layered structure including Au, Ag, Cu, Ni, Pt, Pd, Al, Mo, or Cr, or an alloy such as Al:Nd or Mo:W.

An interlayer insulating layer 118 is formed on the gate electrode 117. The interlayer insulating layer 118 can be formed as an inorganic layer including silicon oxide or silicon nitride. The interlayer insulating layer 118 can include an organic layer.

A source electrode 119 and a drain electrode 121 are formed on the interlayer insulating layer 118. Contact holes 122 are formed in the gate insulating layer 116 and the interlayer insulating layer 118 by selectively removing some parts of the gate insulating layer 116 and the interlayer insulating layer 118. Then, the source electrode 119 is electrically connected to the source region 113 and the drain electrode 121 is electrically connected to the drain region 114 via the contact holes 122.

The source electrode 119 and the drain electrode 121 can be formed of a material that is the same as the gate electrode 117. A protective layer (a passivation layer and/or a planarization layer) 123 is formed on the source electrode 119 and the drain electrode 121 so as to prevent corrosion of the source and drain electrodes 119 and 121 due to moisture and oxygen.

The protective layer 123 can protect and planarize the TFT formed therebeneath. The protective layer 123 can be configured to have various shapes, and can be formed of an organic material such as benzocyclobutene (BCB) or acryl, or an inorganic material such as SiNx. The protective layer 123 can be formed to have a single layer or a multi-layered structure.

The OLED is formed on the TFT.

A first electrode 125 corresponding to a pixel electrode is electrically connected to one of the source electrode 119 and the drain electrode 121 via a contact hole 124.

The first electrode 125 functions as an anode from among electrodes included in the OLED, and can be formed of various conductive materials. The first electrode 125 can be formed as a transparent electrode or a reflective electrode according to an objective thereof.

For example, when the first electrode 125 is used as a transparent electrode, the first electrode 125 can be formed of ITO, IZO, ZnO, or $In_2O_3$. In addition, when the first electrode 125 is used as a reflective electrode, the first electrode 125 can be formed by forming a reflective layer by using Ag, Mg, Al, Pt, Pd, Au, Ni, Nd, Ir, Cr, or a compound thereof, and depositing ITO, IZO, ZnO, or $In_2O_3$ on the reflective layer.

A pixel define layer (PDL) 126 is formed on the protective layer 123 for covering edges of the first electrode 125 of the OLED. The PDL 126 defines a light emission area of each sub-pixel by surrounding the edges of the first electrode 125.

The PDL 126 can be formed of an organic material or an inorganic material.

For example, the PDL 126 can be formed of an organic material such as polyimide, polyamide, BCB, an acrylic resin, a phenol resin, etc., or an inorganic material such as SiNx. The PDL 126 can be variously modified, for example, to include a single layer or a multi-layered structure.

An intermediate layer 127 is formed on the first electrode 125 or on a portion exposed by etching the PDL 126 partially. The intermediate layer 127 can be formed by a deposition process.

According to the present embodiment, the intermediate layer 127 is patterned to only correspond to each sub-pixel, that is, the patterned first electrode 125; however, the above structure is shown for convenience of describing a configuration of the sub-pixel and the intermediate layer 127 can be modified variously.

The intermediate layer 127 can be formed of a low molecular organic material or a high molecular organic material.

The intermediate layer 127 includes an emission layer and can further include at least one of a hole injection layer (HIL), a hole transport layer (HTL), an electron transport layer (ETL), and an electron injection layer (EIL). However, the present embodiment is not limited thereto, and the intermediate layer 127 can include an organic emission layer and can further include other various functional layers.

A second electrode 128 corresponding to a common electrode of the OLED is formed on the intermediate layer 127. The second electrode 128 can be formed as a transparent or a reflective electrode, like the first electrode 125.

The first electrode 125 and the second electrode 128 are insulated from each other by the intermediate layer 127. When voltages are applied to the first electrode 125 and the second electrode 128, the intermediate layer 127 emits visible light so as to display images that can be recognized by a user.

When the second electrode 128 is formed as a transparent electrode, metal having a small work function, that is, Li, Ca, LiF/Ca, LiF/Al, Al, Mg, or a compound thereof is deposited on the intermediate layer 127, and an auxiliary electrode formed of a transparent material such as ITO, IZO, ZnO, or $In_2O_3$ can be further formed on the metal or the compound thereof.

When the second electrode 128 is formed as a reflective electrode, Li, Ca, LiF/Ca, LiF/Al, Al, Mg, or a compound thereof can be entirely deposited to form the second electrode 128.

In addition, the first electrode 125 can be formed to correspond to an opening in each of the sub-pixels when it is formed as a transparent electrode or a reflective electrode. The second electrode 128 can be obtained by forming a transparent electrode or a reflective electrode on the entire display area.

Otherwise, the second electrode 128 can be formed to have various patterns, instead of forming the transparent electrode or the reflective electrode throughout the entire display area. The first electrode 125 and the second electrode 128 can be located opposite to the above embodiment.

The circuit area CA can include various circuit patterns, for example, a power supply pattern, an anti-electrostatic pattern, and other various circuit patterns.

For example, a circuit line 129 is formed on the circuit area CA. The circuit line 129 is formed on the protective layer 123. The circuit line 129 can be formed of the same material as that of the first electrode 125.

The circuit line 129 is connected to a power line 130. The power line 130 is formed on the interlayer insulating layer 119. The power line 130 can be formed of the same material as that of the source electrode 119 and the drain electrode 121.

The circuit line 129 and the power line 130 are electrically connected to the second electrode 128.

The sealing portion 200 is formed on the cell seal area CSA. The sealing portion 200 is formed between the substrate 110 and the encapsulation portion 140. The sealing portion 200 is formed on the cell seal area CSA along edges of the display panel 160. The sealing portion 200 can be formed as a continuous line for protecting the display unit 120. The sealing portion 200 performs a sealing function between the substrate 110 and the encapsulation portion 140.

The sealing portion 200 can include a glass frit. The glass frit is fabricated by mixing oxide powder in glass powder. An organic material is added to the glass frit including the oxide powder to fabricate paste of a gel phase, and then, the paste is baked in a temperature ranging from about 300° C. to about 500° C. When baking the glass frit, the organic material is vaporized into the atmosphere, and the paste of the gel phase is hardened to a frit of a solid phase.

The encapsulation portion 140 is coupled to the substrate 110. The encapsulation portion 140 can protect the OLED and other thin films from external moist or oxygen.

The encapsulation portion 140 can be glass having rigidity, a polymer resin, or a film having flexibility. The encapsulation portion 140 can be formed by alternately stacking organic layers and inorganic layers on the OLED. Here, a plurality of organic layers and a plurality of inorganic layers can be used.

Touch screen panel lines 159 that are electrically connected to the first and second electrode pattern units 151 and 152 formed on the touch screen panel 150 of FIG. 3 are formed on the encapsulation portion 140.

The touch screen panel lines 159 are located in the circuit area CA of the display panel 160. In the circuit area CA, the touch screen panel lines 159 can be patterned on an outer surface of the encapsulation portion 200 substantially perpendicular to a direction in which the display panel 160 is formed.

The align key 220 is formed on the encapsulation portion 140.

The align key 220 is located in the corresponding cell seal area CSA of the display panel 160. In the cell seal area CSA, the align key 220 can be patterned on the outer surface of the encapsulation portion 140 substantially perpendicular to the direction in which the display panel 160 is formed.

The align key 220 can be formed at the same surface as a surface of the encapsulation portion 140, on which the touch screen panel lines 159 are formed. The align key 220 can be formed of the same material as that of the touch screen panel lines 159. For example, the material can be a conductive material such as molybdenum (Mo). The align key 220 can be formed in the same process as the process for forming the touch screen panel lines 159.

The laser irradiation device (290 of FIG. 2) can irradiate a laser beam onto the sealing portion 200 located between the substrate 110 and the encapsulation portion 140. The sealing portion 200 can thereby be melted so that the substrate 110 and the encapsulation portion 140 are firmly coupled to each other.

Also, in the display device 100, the display panel 160 and the window cover (180 of FIG. 1) are aligned with each other at right positions by using the align key 220 to be coupled to each other.

In some embodiments, at the location where the align key 220 is formed, the laser beam is reflected by the align key 220 formed of metal, and the laser beam does not pass through the encapsulation portion 140.

In particular, the display device 100 has to reduce an unnecessary region, that is, a dead space, so as to increase the active area in which the images are displayed. For example, a width of the cell seal area CSA has to be reduced to be as small as possible for a predetermined display size.

When the width of the cell seal area CSA is reduced, an occupying area of the align key 220 can be increased relative to a region overlapping with the sealing portion 200.

Therefore, an effective seal width of the sealing portion 200 is reduced. When the region of the sealing portion 200 to which the laser beam is directly irradiated is reduced due to the align key 220, a strength of the sealing portion 200 is degraded.

According to the present embodiment, the align key 220 includes at least one laser beam through portion 222 for transmitting the laser beam onto the sealing portion 200. This will be described in detail below.

Figure 5:
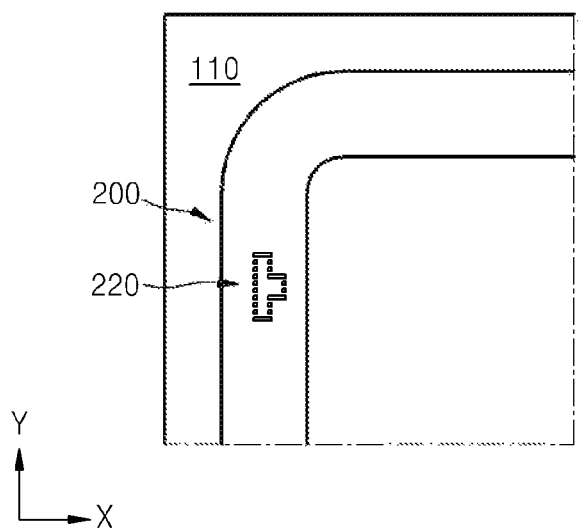
FIG. 5 is a plan view showing an expanded view of a sealing portion of FIG. 4.
Figure 6:
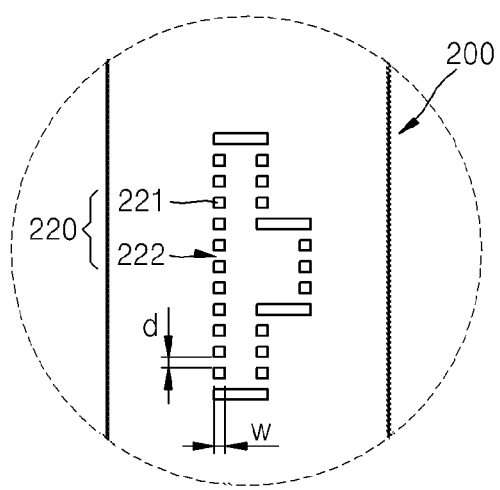
FIG. 6 is a plan view showing an expanded view of an align key of FIG. 5.

FIG. 5 is a plan view showing an expanded view of the sealing portion 200 of FIG. 4. FIG. 6 is a plan view showing an expanded view of the align key 220 of FIG. 5.

Referring to FIGS. 5 and 6, the align key 220 is located to overlap with the sealing portion 200 in a direction substantially perpendicular to the display panel (160 of FIG. 4). The align key 220 is formed at or near a corner of the display panel 160. However, the sealing portion 220 is formed as a continuous line along the edges of the display panel 160.

In the present embodiment, one align key 220 is formed at each of the corners; however, the number of align key 220 is not limited thereto, provided that the align key 220 can be formed at or near the corners of the display panel 160.

The align key 220 is formed to have a certain shape at a location corresponding to the sealing portion 200. In the present embodiment, the align key 220 includes a plurality of lines or align key portions 221 forming an outer appearance of the align key 220. The lines 221 are not continuously connected but intermittently arranged. In the present embodiment, the lines 221 are patterned as dot types.

In some embodiments, the laser beam through portion 222 is formed between two adjacent lines 221. The laser beam through portion 222 corresponds to a space between every two separate lines 221 that form the outer appearance of the align key 220.

Here, a width w of each of the lines 221 is equal to or less than about 12 μm, and a distance d between the two adjacent lines 221 can range from about 2 μm to about 4 μm, but the width w and the distance d are not limited thereto. The width w of each of the lines 221 and the distance d between the two adjacent lines 221 can be adjustable according to performances of the optical measurement device that measures the align key 220.

A plurality of laser beam through portions 222 are formed in the align key 220 so as to provide paths through which the laser beam irradiated from the laser irradiation device 290 can pass.

Therefore, an intensity of energy irradiated to the sealing portion 200 can be increased. Accordingly, a desired amount of thermal energy can be applied to the sealing portion 200, and thus, a mechanical strength of the sealing portion 200 can be improved.

Figure 7:
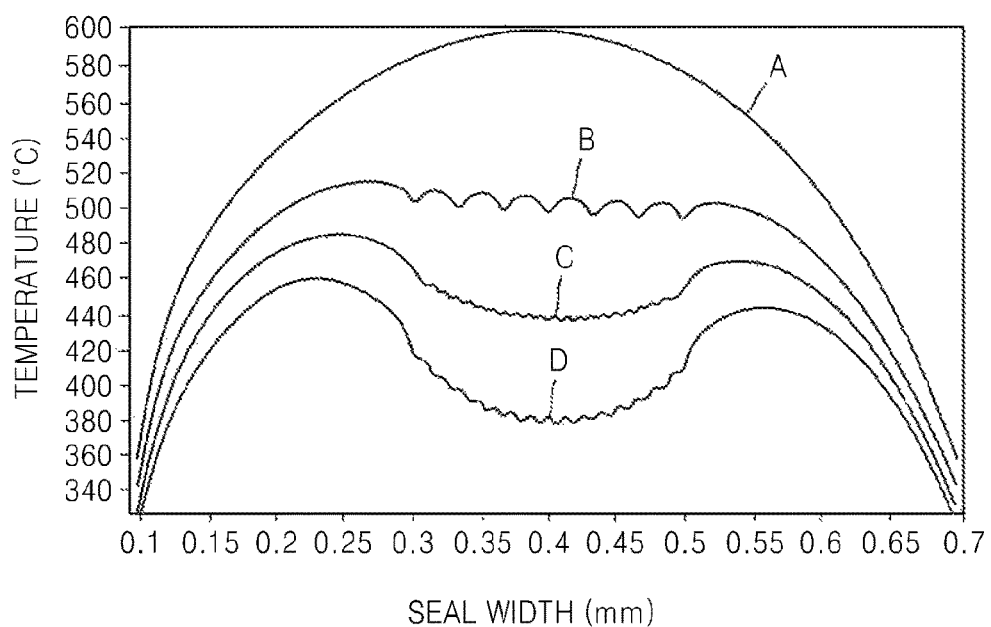
FIG. 7 is a graph of a temperature characteristic of the sealing portion according to a shape of the align key according to an embodiment.

FIG. 7 is a graph showing a temperature characteristic of the sealing portion 200 according to formation of the align key 220.

Here, the x-axis denotes a seal width, and the y-axis denotes a sealing temperature.

In the x-axis, an entire seal width is formed to be about 650 μm, that is converted and rounded into millimeters according to the widths displayed along the x-axis. For example, the seal width of about 650 μm corresponds to about 0.7 mm, and about 325 μm corresponds to about 0.35 mm.

In addition, a curve A denotes a case in which the align key 220 is not formed on the sealing portion (200 of FIG. 6). Curves B through D denote cases in which the dot type align key 220 is formed on the sealing portion 200. Here, Areas of the laser beam through portions 222 increase in the order of curve D, curve C and curve B.

Referring to the graph of FIG. 7, the curve A shows a sealing temperature of about 600° C. for a seal width of about 0.35 mm, that is, substantially the center of the sealing portion 200. However, the curves B, C, and D respectively show sealing temperatures of about 510° C., about 440° C., and about 390° C. for a seal width of about 0.35 mm.

As such, when increasing the area of the laser beam through portion 222, the thermal energy applied to the sealing portion 200 is increased. Accordingly, heat resistance of the sealing portion 200 can be improved.

As described above, according to the display device of the embodiments of the described technology, the laser beam through portions are formed in the align key so that an irradiation amount of the laser beam onto the sealing portion is increased. Thus, a mechanical strength of the sealing portion 200 can be improved, and reliability of the sealing portion 200 can be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the inventive technology have been described with reference to the figures, it will be understood by those of ordinary skill in the art that various changes in form and details can be made therein without departing from the spirit and scope of the described technology as defined by the following claims.

What is claimed is:

1. A display device comprising:
a display panel including:
a substrate;
a display unit formed over the substrate; and
an encapsulation portion formed over the display unit;
a touch screen panel formed over the encapsulation portion;
a window cover formed over the touch screen panel;
at least one align key configured to align the display panel with the window cover; and
a sealing portion formed between the substrate and the encapsulation portion, wherein the align key has at least one laser beam through portion configured to permit passage of a laser beam through the encapsulation portion to the sealing portion, wherein the align key has a bottom surface contacting the encapsulation portion, wherein the sealing portion has a top surface contacting the encapsulation portion, and wherein the bottom surface of the align key has a width that is less than that of the top surface of the sealing portion.

2. The display device of claim 1, wherein the align key is formed on the encapsulation portion to align with the sealing portion formed on the display panel.

3. The display device of claim 2, wherein the sealing portion and the align key at least partially overlap each other.

4. The display device of claim 2, wherein the align key further comprises a plurality of align key portions separated from each other, and wherein the at least one laser beam through portion corresponds to a space between the align key portions.

5. The display device of claim 4, wherein each of the align key portions has a dot shape, and wherein the align key portions have a dot pattern.

6. The display device of claim 4, wherein the width of at least one of the align key portions is greater than a distance between two adjacent align key portions.

7. The display device of claim 2, wherein the sealing portion is continuously formed along edges of the display panel.

8. The display device of claim 2, wherein the align key is formed in a corner of the display panel.

9. The display device of claim 1, wherein the touch screen panel comprises a plurality of electrode pattern units formed on the encapsulation portion and at least one insulating layer separating the electrode pattern units from each other, wherein the align key is formed on a surface of the encapsulation portion, and wherein a plurality of touch screen panel lines electrically connected to the electrode pattern units are formed on the encapsulation portion.

10. The display device of claim 9, wherein the electrode pattern units comprise first and second electrode pattern units, wherein the first electrode pattern units are spaced apart from each other and arranged in a first direction, and wherein the second electrode pattern units are spaced apart from each other and arranged in a second direction crossing the first direction.

11. The display device of claim 9, wherein the substrate comprises an i) active area on which the display unit is formed, ii) a circuit area extending from the active area, and iii) a cell seal area extending from the circuit area and including the sealing portion, wherein the touch screen panel lines are formed on the encapsulation portion corresponding to the circuit area, and wherein the align key is formed on the encapsulation portion corresponding to the cell seal area.

12. The display device of claim 1, wherein the align key is formed of a conductive material.

13. The display device of claim 1, wherein the touch screen panel is one of the following: a resistive type touch screen, an electro-magnetic type touch screen, a saw type touch screen, and an infrared type touch screen.

14. The display device of claim 1, wherein the display unit comprises:
   a thin film transistor (TFT); and
   an organic light-emitting diode i) electrically connected to the TFT and ii) including first and second electrodes and an emission layer formed between the first and second electrodes.

15. The display device of claim 1, wherein the sealing portion comprises a glass frit.

16. The display device of claim 1, wherein the align key has a "T" shape.

17. The display device of claim 1, wherein the align key completely overlaps the sealing portion in the depth dimension of the display device, and wherein the sealing portion directly contacts the encapsulation portion.

18. The display device of claim 1, further comprising a plurality of touch screen panel lines electrically connected to the touch screen panel, wherein the substrate comprises an i) active area on which the display unit is formed, ii) a circuit area extending from the active area, and iii) a cell seal area extending from the circuit area and including the sealing portion, wherein the touch screen panel lines are formed on the encapsulation portion corresponding to the circuit area, and wherein the align key is formed on the encapsulation portion corresponding to the cell seal area.

* * * * *